United States Patent
Koifman et al.

[11] Patent Number: 5,978,249
[45] Date of Patent: Nov. 2, 1999

[54] HIGH IMPEDANCE SIGNAL CONVERSION CIRCUIT AND METHOD

[75] Inventors: Vladimir Koifman, Rishon Lezion; Yachin Afek, Kfar Saba, both of Israel

[73] Assignee: Motorola Inc., Schaumburg, Ill.

[21] Appl. No.: 08/992,465

[22] Filed: Dec. 17, 1997

[51] Int. Cl.[6] .................................................. G11C 17/00
[52] U.S. Cl. ...................... 365/100; 365/227; 365/207; 323/315; 324/251
[58] Field of Search ............................ 327/100; 331/113; 330/136; 323/315; 324/251; 365/227, 207, 185.21, 226, 100, 148

[56] References Cited

U.S. PATENT DOCUMENTS

| | | |
|---|---|---|
| 4,835,487 | 5/1989 | Doyle et al. . |
| 5,216,385 | 6/1993 | McDaniel . |
| 5,475,342 | 12/1995 | Nakamura et al. ...................... 330/136 |
| 5,525,897 | 6/1996 | Smith ....................................... 323/315 |
| 5,550,469 | 8/1996 | Tanabe et al. ........................... 324/251 |

OTHER PUBLICATIONS

Tietze U., Schenk, Ch.: "Halbleiter–Schaltungstechnik", Zehnte Auflage (10th Edition), Springer Verlag, Berlin, Heidelberg, New York, ISBN 3–540–56184–6, chapter 13.3.3. on pp. 371–378, figure 13.11. Book also available in English (published by Springer in 1991).

*Primary Examiner*—David Nelms
*Assistant Examiner*—Thong Le

[57] ABSTRACT

A circuit (200) comprises transistors (240, 250, 260), an operational amplifier (270) and serially coupled resistors (210, 220). The circuit (200) is coupled to reference lines (201, 202). An input voltage $V_X$ on an input terminal (203) is applied across the resistors (210, 220) and divided to an output voltage $V_Y$ on an output terminal (204). Output voltage $V_Y$ is measured (as $V_M$) by the operational amplifier (270). The operational amplifier (270) controls a current $I_A$ in a first current path between the reference lines (201, 202). The current $I_A$ is mirrored to a current $I_S$ in a second current path through the resistors (210, 220). The current $I_S$ is generated by one of the transistors (260) and substantially proportional to the input voltage $V_X$. Therefore, the resistors (210, 220) do not substantially load the input and the circuit (200) exhibits a high input impedance.

18 Claims, 3 Drawing Sheets ations.

HIGH IMPEDANCE SIGNAL CONVERSION CIRCUIT AND METHOD

FIELD OF THE INVENTION

The present invention generally relates to electronic circuits, and, more particularly to a circuit for converting voltages.

BACKGROUND OF THE INVENTION

In modern technologies, electronic devices, such as computers, printers, scanners, modems, are getting more and more compatible and interchangeable. Also, supply voltages for such devices are decreasing.

FIG. 1 is a simplified block diagram of a prior art arrangement of device 10 with supply voltage $V_{S1}$ (e.g., so-called rail-to-rail voltage) and device 20 having supply voltage $V_{S2} \leq V_{S1}$. Convenient examples for the voltages are $V_{S1}=5$ volts and $V_{S2}=3.3$ volts. Device 10 may send signals 15 having temporarily a voltage $V_1 < V_{S1}$ to device 20. Second device 20 must accommodate $V_{S1}$. Device 20 receives signal 15 by voltage divider 30 serving as a signal conversion circuit. Voltage divider 30 has resistors 31 and 32 serially coupled to common reference 35 of circuits 10 and 20. With magnitudes $R_A$ and $R_B$ of resistors 31 and 32, respectively, voltage divider 30 provides an intermediate voltage $V_2$:

$$V_2 = \frac{R_B}{R_A + R_B} * V_1 \quad (1)$$

Voltage divider 30 consumes a current I:

$$I = \frac{V_1}{(R_A + R_B)} \quad (2)$$

Such a current leads to power consumption in device 10 which is not convenient. In other words, circuit 10 must have enough drive capability to accommodate a low input impedance of the conversion circuit (e.g., voltage divider 30) in device 20. The impedance of circuit 20 should be high, not low. A configuration as in FIG. 1 is especially inconvenient when circuit 10 is a battery powered interface whose battery is discharged by current I.

The present invention seeks to provide an improved signal conversion circuit which mitigates or avoid the above mentioned and other disadvantages and limitations of the prior art.

DETAILED DESCRIPTION OF A PREFERRED EMBODIMENT

Figure 2:
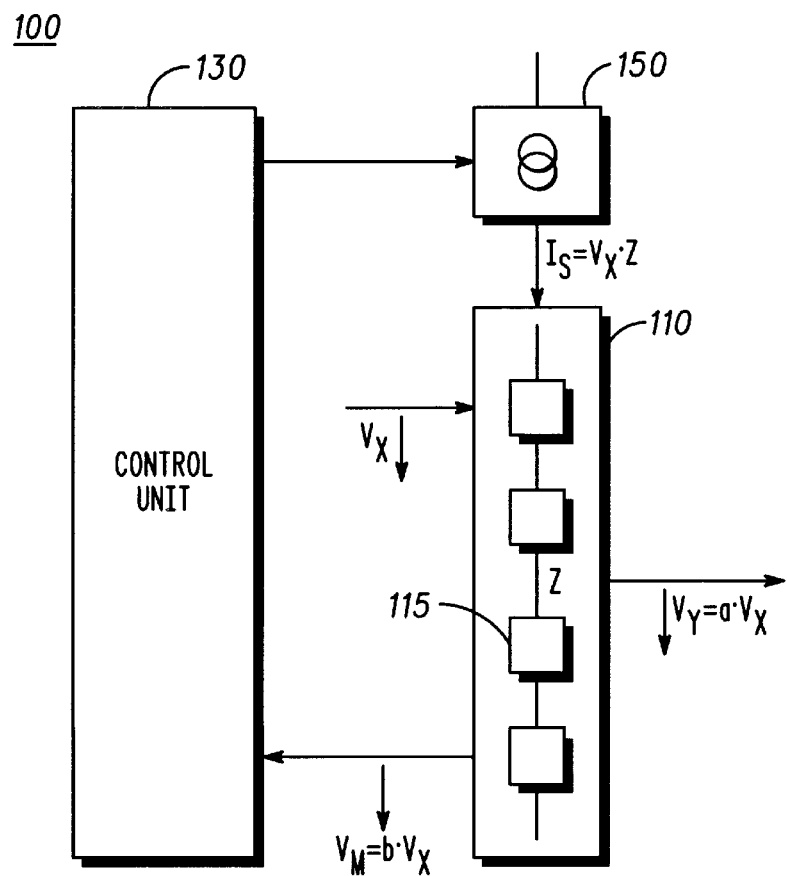
FIG. 2 illustrates a simplified block diagram of a circuit of the present invention.

FIG. 2 illustrates a simplified block diagram of signal conversion circuit 100 (hereinafter circuit 100) of the present invention. Circuit 100 comprises variable current source 150, network 110 of elements 115 and control unit 130. Preferably, elements 115 of network 110 are serially coupled. Network 110 has an impedance Z. Impedance Z is intended to include ohmic resistors R, capacities C, inductances L and combinations thereof. Network 110 receives input voltage $V_X$ and provides measurement voltage $V_M$ and output voltage $V_Y$. Preferably, the voltages are related as:

$$V_M = b * V_X \quad (3)$$

$$V_Y = a * V_X \quad (4)$$

with factors a and b being complex numbers. Preferably, a and b are real numbers between 0 and 1. Conveniently, network 110 has at least two elements 115 in a voltage divider configuration. But this is not essential.

Current source 150 generates current $I_S$. Control unit 130 receives measurement voltage $V_M$ and controls current source 150 such that:

$$I_S = V_X / Z \quad (5)$$

with the fraction line for division. In other words, the current $I_S$ through network 110 follows a fraction (e.g., $V_M$) of the input voltage $V_X$. Control unit 130 is conveniently an amplifier which does not require the full swing of $V_X$, but accommodates the smaller swing of voltage $V_M$. Conveniently, impedance Z is substantially independent from input voltage $V_X$.

Figure 3:
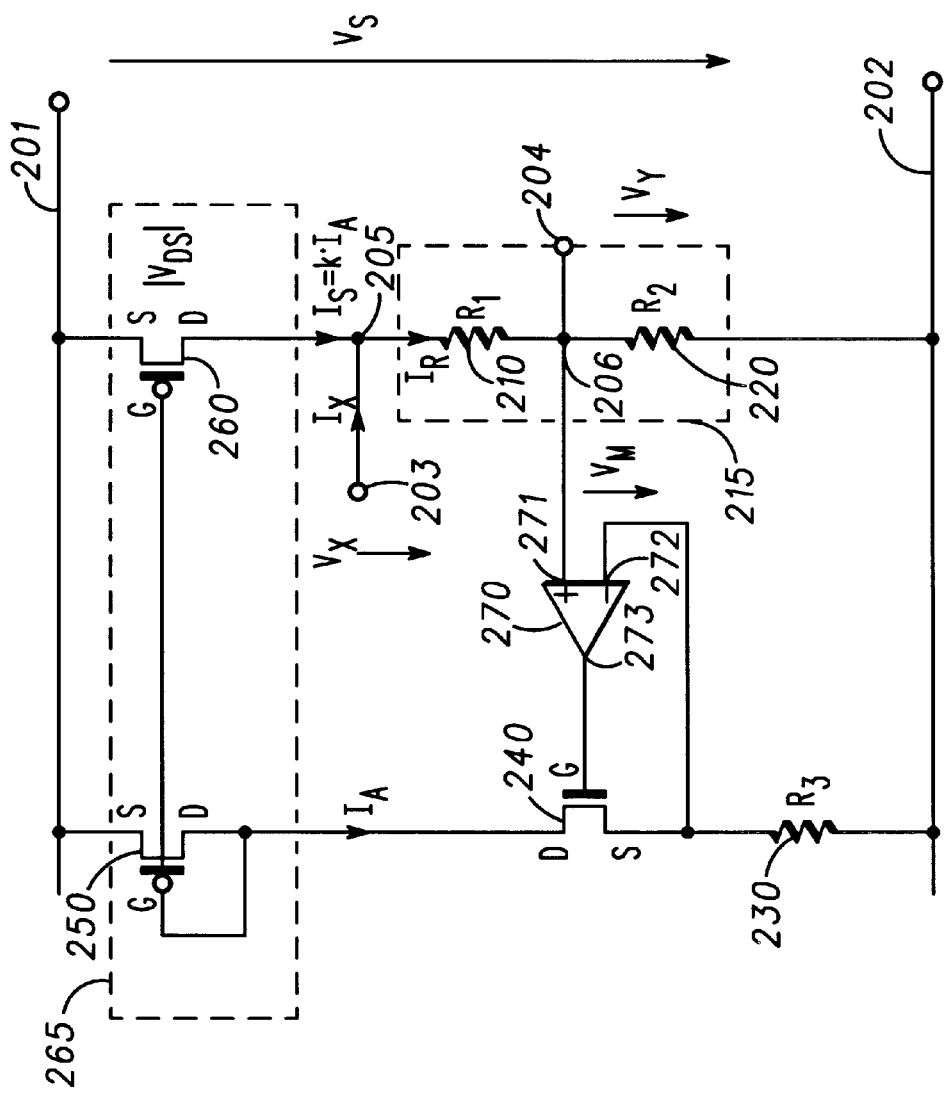
FIG. 3 illustrates a simplified circuit diagram of a circuit in a first embodiment of the present invention.

Before explaining details of the present invention in connection with FIG. 3, conventions used herein are explained. The term "transistor" is intended to include any device having at least two main electrodes and a control electrode. The impedance between the main elements is controlled by a signal applied to the control electrode. The transistors used to implement the present invention are, preferably, field effect transistors (FET) having source (S) and drain (D) as main electrodes and a gate (G) as control electrode. For convenience, the abbreviations also appear in the figures. Since FET are typically symmetrical components, the true designation of "source" and "drain" is only possible once a voltage is impressed on the terminals. The designation of sources (S) and drains (D) herein should therefore be interpreted in the broadest sense. Transistors can also be bipolar transistors with, for example, collectors and emitters as main electrodes and bases as control electrodes, or other devices. The present invention is useful but not limited to CMOS-technology using P-channel FET ("P-FET") and N-channel FET ("N-FET"). The terms "first type" (e.g., for P-FET 260) and "second type" (e.g., for N-FET 240) are intended to distinguish complementary transistors of opposite conductivity. For convenience, FIG. 3 illustrate the gates (G) of P-FET by small circles.

FIG. 3 illustrates a simplified circuit diagram of circuit 200 in a preferred embodiment of the present invention. Circuit 200 is based on circuit 100 of FIG. 2. Circuit 200 comprises resistors 210, 220 and 230, transistors 240, 250 and 260, and operational amplifier (op amp) 270. Transistors 250 and 260 are preferably, P-FETs and transistor 240 is an N-FET. Circuits 200 receives a supply voltage $V_S$ between reference lines 201 and 202. Circuit 200 receives an input voltage $V_X$ at input terminal 203 and provides an output voltage $V_Y$ at output terminal 204. For convenience, voltages are referred to line 202. Transistors 250 and 260 form current mirror 265 (dashed frame). Resistors 210 and 220 form voltage divider 215 (dashed frame). Transistor 250 has the function of a variable current source 150.

The source (S) of transistor 260 is coupled to line 201. The drain (D) of transistor 260 is coupled to resistor 210 at node 205. Resistor 210 is serially coupled to line 202 via node 206 and resistor 220. Input terminal 203 is coupled to node 205; and output terminal 204 is coupled to node 206. Node 206 is coupled to non-inverting input 271 of op amp 270. Inverting input 272 of op amp 270 is coupled to the source (S) of transistor 240 and coupled to line 202 via resistor 230. Output 273 of op amp 270 is coupled to the gate (G) of transistor 240. The drain (D) of transistor 240 is coupled to the drain (D) and to the gate (G) of transistor 250 and to the gate (G) of transistor 260. The source (S) of transistor 250 is coupled to line 201.

Resistors 210, 220, and 230 have resistance magnitudes $R_1$, $R_2$, and $R_3$, respectively. The source-drain path of transistor 260 provides current $I_S$ which flows into node 205. Input current $I_X$ also flows into node 205 and is combined with current $I_S$ to provide current $I_R$ trough resistors 210 and 220:

$$I_R = I_S + I_X \qquad (6)$$

Equation (6) is the application of Kirchhoff's Node Law. For convenience of explanation, the currents from node 206 to output terminal 204 and to input 271 of op amp 270 are neglected. Input voltage $V_X$ appears across resistors 210 and 220 between nodes 205 and line 202. Output voltage $V_Y$ and measurement voltage $V_M$ appear across resistor 220 between node 206 and line 202. In the example of FIG. 3, output voltage and measurement voltage are substantially equal ($\approx$):

$$V_Y \approx V_M \text{ (i.e., } a \approx b) \qquad (7)$$

Voltages $V_M$ depends on input voltage $V_X$ and the values $R_1$ of resistor 210 and $R_2$ of resistors 220 according to the well known relation for voltage dividers:

$$V_M = V_X * \frac{R_2}{R_1 + R_2} \qquad (8)$$

with the symbol * for multiplication. The source-drain paths of transistors 240 and 250 carry current $I_A$ conveniently defined in the direction from line 201 to line 202. Op amp 270, resistor 230 and transistor 240 form a voltage controlled current source. Current $I_A$ is related to $V_M$ trough the magnitude $R_3$ of resistor 230:

$$I_A = V_M / R_3 \qquad (9)$$

Transistors 250 and 260 of current mirror 265 provide current $I_S$ by scaling current $I_A$ with a substantially proportional factor k:

$$I_S = k * I_A \qquad (10)$$

Factor k is a real number and related to the magnitudes $R_3$ and $R_2$ as:

$$k = R_3 / R_2 \qquad (11)$$

Preferably, the magnitudes of resistors 220 and 230 are substantially equal ($\approx$):

$$R_2 \approx R_3 \qquad (12)$$

so that factor k is about $k \approx 1$. But other values can also be used.

Assume that transistor 260 is disconnected from circuit 200 and input voltage $V_X$ causes current $I_R$ through resistors 210 and 220 according to:

$$I_X = I_R = \frac{V_X}{(R_1 + R_2)} \qquad (13)$$

Such an arrangement would have low impedance and would take energy from input terminal 203. According to the invention, current $I_R$ is substantially provided by variable currents source 150 (e.g., transistor 260):

$$I_R \approx I_S \qquad (14)$$

$I_X$ can be neglected and assumed to be around zero:

$$I_X \approx 0 \qquad (15)$$

Changes in the magnitude of $I_S$ are controlled according to changes in the magnitude of input voltage $V_X$. Using equations (8), (9), and (10), $I_S$ is calculated as:

$$I_S = \frac{k * V_M}{R_3} \quad \text{(9) into (10)} \qquad (16)$$

$$I_S = \frac{R_2 * k * V_X}{(R_1 + R_2) * R_3} \quad \text{(8) into (15)} \qquad (17)$$

It is also convenient when currents $I_S$ and $I_A$ are also substantially equal:

$$I_S \approx I_A \text{ (i.e., } k \approx 1) \qquad (18)$$

Resistors 210 and 220 are, conveniently related as:

$$R_2 = r * R_1 \qquad (19)$$

Factor r is conveniently a real number from almost zero ($r \approx 0$) to $r \approx 10$ or higher. Preferably, factor r has a value of about:

$$0.05 \approx < r \approx < 1 \qquad (20)$$

It is an important advantage of the present invention that circuit 200 can be used in modern low voltage applications. For convenience, voltages are considered as absolute values $|\,|$. The supply voltage $|V_S|$ is larger to or substantially equal ($\geq$) to the sum of the drain-source voltage $|V_{DS}|$ of transistor 260 (line 201 and node 205) and input voltage $V_X$ (node 205 to line 202):

$$|V_S| \geq |V_{DS}| + |V_X| \qquad (21)$$

Transistor 260 preferably operates in the saturation region so that the voltage $|V_{DS}|$ is a saturation ("SAT") voltage $|V_{DSAT}|$. Input voltage $V_X$ can be expressed by $R_1$, $R_2$, and $I_S$. Supply voltage $|V_S|$ can also be estimated as:

$$|V_S| \geq |V_{DSAT}| + \{(R_1 + R_2) * I_S\} \qquad (22)$$

When circuit 200 is implemented on a monolithic chip with a CMOS-process, supply voltage $|V_S|$ can be as low as, for example and not intended to be limiting 1.8 volts.

Circuit 200 of the present invention is compared to resistor arrangement 31/32 in device 20 of the prior art. By simulation, similar sine signals are applied as input signals and the input currents are measured. The simulation method is SPICE, but other simulation methods well known in the art would lead to similar results. Resistance magnitude are, for example, $$R_A = R_1 = 10 \ k\Omega \text{ (resistors 31 and 210, respectively)} \qquad (23)$$

$$R_B=R_2=10\ k\Omega\ \text{(resistors 32 and 220, respectively)} \quad (24)$$

Figure 1:
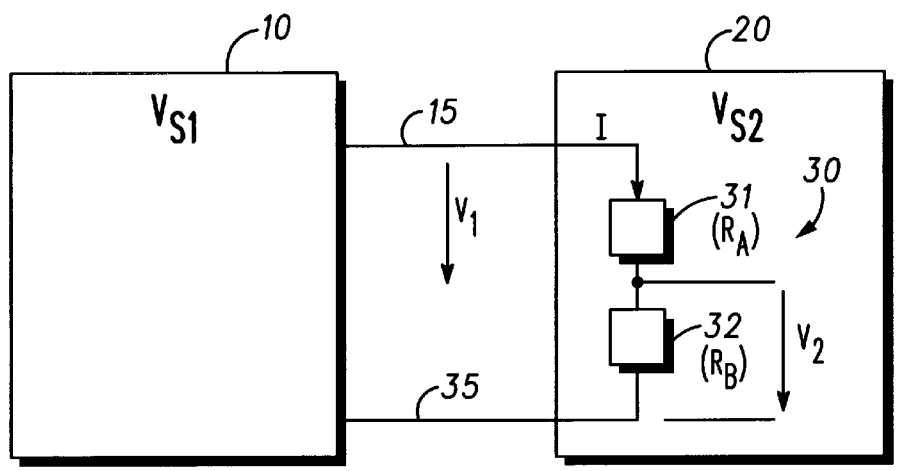
FIG. 1 illustrates a simplified block diagram of a prior art arrangement of a first circuit with a first supply voltage and a second circuit with a second supply voltage.

(a) First, a voltage $V_1$ was applied across resistors 31 and 32 (cf. FIG. 1) of prior art circuit 20. In a well known representation, voltage $V_1$ is expressed as:

$$V_1=V_{DC}+V_{AC}*\sin(2*\pi*F*t) \quad (25)$$

with frequency F, time t, $\pi \approx 3.14\ldots$, and "sin" for the sine function. The usual abbreviations "DC" and "AC" stand for "direct current" and for "alternating current", respectively. The frequency was F≈5 MHz. A resulting current I, similarly expressed as:

$$I=I_{DC}+I_{AC}*\sin(2*\pi*F*t) \quad (26)$$

was determined with $I_{DC} \approx 100\ \mu A$ and $I_{AC} \approx 5\ \mu A$.

(b) Second, a similar voltage $V_X \approx V_1$ with the same frequency F was applied to circuit 200 of the present invention. A resulting current $I_X$ was determined with $I_{DC}' \approx 2\ \mu A$ and $I_{AC}' \approx 1\ \mu A$. Circuit 200 has input current $I_X$ which is about 5 times (for AC) and 50 times (for DC) lower than input current I of prior art arrangement 31/32. In other words, circuit 200 has a high input impedance and does not significantly load the source of $I_X$.

Figure 4:
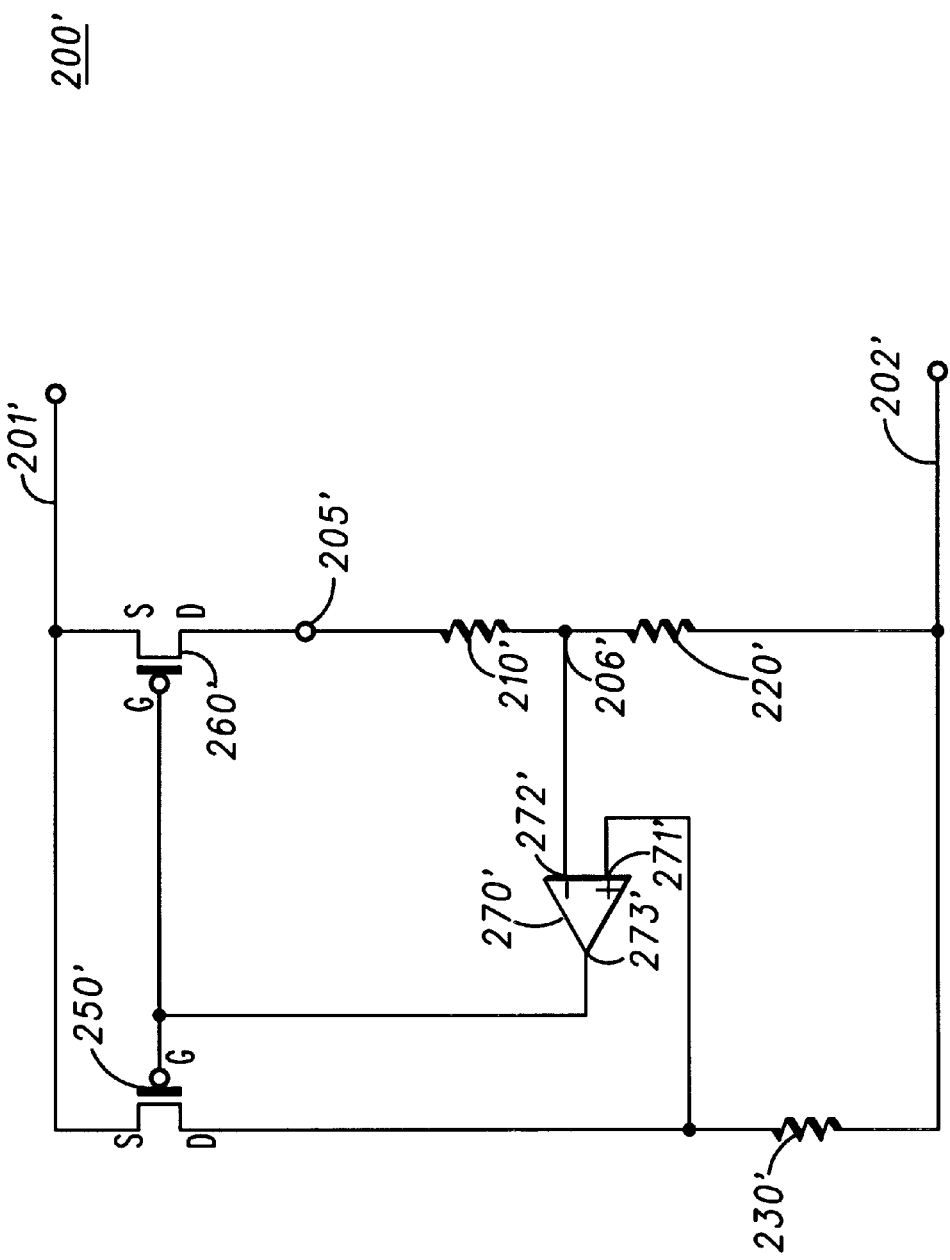
FIG. 4 illustrates a simplified circuit diagram of a circuit in a second embodiment of the present invention.

FIG. 4 illustrates a simplified circuit diagram of circuit 200' in a second embodiment of the present invention. Circuit 200' is a variation of circuit 200 (FIG. 3) without optional transistor 240. Primed reference numbers in FIG. 4 correspond to unprimed numbers in FIG. 3. For simplicity, voltages and currents are not illustrated in FIG. 4. Circuit 200' comprises transistors 250' and 260', resistors 210', 220', and 230' and op amp 270'. Transistors 250' and 260' are, preferably, P-FETs. Circuit 200' has a first current path from line 201 to line 202 with serially coupled source (S) and drain (D) of transistor 260', node 205', resistor 210', node 206', and resistor 220'.

Circuit 200' has a second current path with the source (S) of transistor 250' coupled to line 201', the drain (D) of transistor 250' coupled to line 202' via resistor 230'. Output 273' of op amp 270' is coupled to the gates (G) of transistors 250' and 260'. Non-inverting input 271' of op amp 270 is coupled to the drain (D) of transistor 250'. Inverting input 272' of op amp 270 is coupled to node 206'.

The operation of circuit 100 and its embodiments in circuits 200 and 200' can be described as a method of the present invention. The method provides a substantially constant impedance between a first node (e.g., node 205) and a second node (e.g., line 202) which receive a voltage $V_X$. The method comprises the following steps:

(1) A partial voltage $V_M$ is measured between reference points located between the nodes. The reference points are, for example, node 206 and line 202 (FIG. 3). One of the reference points can be obtained, for example, by a resistor voltage divider (e.g., resistors 210 and 220) between the nodes.

(2) A current $I_S$ is provided to the first node. The current $I_S$ has a variable magnitude which corresponds to a magnitude of a current $I_X$ which is caused by $V_X$ across a resistance (e.g., $R_1+R_2$) between the nodes. Current $I_S$ can be provided by converting the partial voltage $V_M$ to a current $I_A$ (e.g., in op amp 270) and mirroring the current $I_A$ (by e.g., transistors 250 and 260).

While the invention has been described in terms of particular structures, devices and methods, those of skill in the art will understand based on the description herein that it is not limited merely to such examples and that the full scope of the invention is properly determined by the claims that follow.

We claim:

1. A circuit, comprising:
   (a) a first resistor and a second resistor serially coupled for receiving a variable input voltage $V_X$ across said first and second resistors and
   providing an output voltage $V_Y$ across said second resistor;
   (b) a variable current source serially coupled to said first and second resistors via a first node, for supplying a variable current $I_S$ to said first node;
   (c) a control unit coupled to said first and second resistors for measuring a voltage $V_M$ at a second node between said first and second resistors and controlling said variable current source such that said variable current $I_S$ supplied to said first and second resistors is proportional to said variable input voltage $V_X$.

2. The circuit of claim 1 wherein said current source is a current mirror which receives a current $I_A$ from said control unit and provides $I_S=k*I_A$ with a k being a substantially proportional factor.

3. The circuit of claim 2 wherein k≈1.

4. The circuit of claim 1 wherein said voltage $V_M$ is substantially equal to a voltage across said second resistor.

5. The circuit of claim 1 wherein magnitudes $R_1$ and $R_2$ of said first and second resistors, respectively, are related by $R_2=r*R_1$ with $0.05 \approx < r \approx < 1$.

6. The circuit of claim 1 wherein said control unit has an output coupled to said variable current source through a current mirror.

7. The circuit of claim 6 wherein
   said output is coupled to a reference line by a third resistor,
   said second resistor is coupled between said node and said reference line, and
   said second and third resistors have substantially equal magnitudes.

8. A method for providing a substantially constant impedance between a first node and a second node receiving a voltage $V_X$, comprising the steps of:
   (1) measuring a partial voltage $V_M$ between first and second reference points located between said first node and said second node; and
   (2) providing a current $I_S$ to said first node, said current $I_S$ having a variable magnitude corresponding to a magnitude of a current $I_X$ which is caused by $V_X$ across a resistance between said first and second nodes.

9. The method of claim 8 wherein said first reference point is obtained by a resistor voltage divider between said first and second nodes.

10. The method of claim 8 wherein said current $I_S$ is provided by the steps of
    (a) converting said partial voltage $V_M$ to a current $I_A$ and
    (b) mirroring said current $I_A$ to provide current $I_S$.

11. A high impedance signal conversion circuit receiving an input voltage $V_X$ and providing an output voltage $V_Y \leq V_X$,
said circuit comprising:
    a network of at least two elements,
        said network receiving said input voltage $V_X$ and providing
        (1) said output voltage $V_Y=a*V_X$ and
        (2) a measurement voltage $V_M=b*V_X$, said network having a total impedance Z;
    a first transistor having main electrodes serially coupled to said network for providing a current $I_S$ to said network; and an amplifier receiving said measurement voltage $V_M$ and controlling a control electrode of said first transistor, such that said current $I_S$ is $V_X/Z$.

12. The circuit of claim 11 wherein a≈b.

13. The circuit of claim 11 wherein said elements of said network are resistors.

14. The circuit of claim 11 wherein said elements of said network are a first resistor and a second resistor.

15. The circuit of claim 11 wherein said elements of said network are serially coupled.

16. The circuit of claim 11 wherein
said amplifier is an operational amplifier having
(a) a first input receiving said measurement voltage $V_M$;
(b) a second input receiving a reference voltage $V_M$; and
(c) an output coupled to said control electrode.

17. The circuit of claim 16 wherein said output of said operational amplifier is coupled to a reference line by a resistor.

18. The circuit of claim 11 wherein
(a) said network has a first resistor with a magnitude $R_1$ and a second resistor with a magnitude $R_2$,
(b) said second resistor provides said measurement voltage $V_M$,
(c) said amplifier comprises (i) a differential amplifier with a non-inverting input coupled to said second resistor, an inverting input, and an output, (ii) a third resistor being coupled to said inverting input, and (iii) a second transistor having a control electrode coupled to said output and a main electrode coupled to said third resistor for providing an intermediate current $I_A$, a first main electrode coupled to said third resistor, and a second main electrode, and
(d) a fourth transistor mirrors said intermediate current $I_A$ to said current $I_S=k*I_A$.

* * * * *